United States Patent
Zhou et al.

(10) Patent No.: US 10,673,445 B2
(45) Date of Patent: Jun. 2, 2020

(54) TIME-TO-DIGITAL CONVERTER IN PHASE-LOCKED LOOP

(71) Applicant: Huawei Technologies Co., Ltd., Shenzhen (CN)

(72) Inventors: Shenghua Zhou, Shenzhen (CN); Ran Song, Xi'an (CN)

(73) Assignee: Huawei Technologies Co., Ltd., Shenzhen (CN)

(*) Notice: Subject to any disclaimer, the term of this patent is extended or adjusted under 35 U.S.C. 154(b) by 133 days.

(21) Appl. No.: 15/713,410

(22) Filed: Sep. 22, 2017

(65) Prior Publication Data

US 2018/0013437 A1 Jan. 11, 2018

Related U.S. Application Data

(63) Continuation of application No. PCT/CN2015/095807, filed on Nov. 27, 2015.

(30) Foreign Application Priority Data

Mar. 25, 2015 (CN) .......................... 2015 1 0134242

(51) Int. Cl.
*H03L 7/06* (2006.01)
*H03L 7/197* (2006.01)
(Continued)

(52) U.S. Cl.
CPC ............ *H03L 7/197* (2013.01); *G04F 10/005* (2013.01); *H03L 7/085* (2013.01); *H03L 7/0818* (2013.01); *H03L 7/095* (2013.01)

(58) Field of Classification Search
CPC ....... H03L 7/197; H03L 7/085; H03L 7/0818; H03L 7/095; G04F 10/005
(Continued)

(56) References Cited

U.S. PATENT DOCUMENTS 5,945,862 A * 8/1999 Donnelly ............. H03K 5/1565
327/241
6,377,093 B1 4/2002 Lee et al.
(Continued)

FOREIGN PATENT DOCUMENTS

CN 1274200 A 11/2000
CN 101277104 A 10/2008
(Continued)

OTHER PUBLICATIONS

Lee, M. et al., "A 9 b,1.25 ps Resolution Coarse-Fine Time-to-Digital Converter in 90 nm CMOS that Amplifies a Time Residue," IEEE Journal of Solid-State Circuits, XP011206691, Apr. 2008, 9 pages, vol. 43, No. 4.
(Continued)

*Primary Examiner* — Metasebia T Retebo
(74) *Attorney, Agent, or Firm* — Slater Matsil, LLP

(57) ABSTRACT

A time-to-digital converter includes a delay unit into which a first signal is input and a sampling unit into which a second signal is input. The delay unit includes a first delay chain, a second delay chain, and a third delay chain that are connected in series in sequence. The delay unit delays the first signal. The first delay chain includes at least one first delayer. The second delay chain includes at least three second delayers. The third delay chain includes a third delayer. The delay duration of the first delayer and the delay duration of the third delayer are greater than delay duration of the second delayer. The sampling unit samples output signals of first delayers in the first delay chain, second delayers in the second delay chain, and third delayers in the third delay chain at a preset time point of the second signal.

20 Claims, 6 Drawing Sheets

(51) Int. Cl.
*G04F 10/00* (2006.01)
*H03L 7/085* (2006.01)
*H03L 7/081* (2006.01)
*H03L 7/095* (2006.01)

(58) Field of Classification Search
USPC .......................................................... 327/158
See application file for complete search history.

(56) References Cited

U.S. PATENT DOCUMENTS

| | | |
|---|---|---|
| 2002/0153929 A1 | 10/2002 | Yoo |
| 2009/0128322 A1 | 5/2009 | Henzler et al. |
| 2009/0278579 A1 | 11/2009 | Kao et al. |
| 2010/0141314 A1* | 6/2010 | Chen .......... H03L 7/07 327/159 |
| 2012/0313678 A1* | 12/2012 | Felix .......... H03L 5/00 327/156 |
| 2017/0038738 A1 | 2/2017 | Zhou et al. |

FOREIGN PATENT DOCUMENTS

| | | |
|---|---|---|
| CN | 102971967 A | 3/2013 |
| CN | 203608273 U | 5/2014 |
| CN | 103957003 A | 7/2014 |
| CN | 104716955 A | 6/2015 |
| JP | 2003058275 A | 2/2003 |

OTHER PUBLICATIONS

Ramakrishnan, V. et al., "A Wide-Range, High-Resolution, Compact, CMOS Time to Digital Converter," Center for Integrated Circuits and Systems, IEEE, XP010883475, 6 Pages, Richardson, TX.

Chen, Y. et al., "A high resolution FPGA-based TDC with Nonlinearity Calibration," 2012 International Symposium on Instrumentation & Measurement, Sensor Network and Automation (IMSNA), IEEE, XP032456630, 4 pages, Taiwan.

Zanuso, M. et al., "Time-to-Digital Converter with 3-ps Resolution and Digital Linearization Algorithm," Dipartimento di Elettronica e Informazione, Politecnico di Milano, XP031788535, 4 Pages, Milan, Italy.

* cited by examiner

<Prior Art>

_US 10,673,445 B2_

TIME-TO-DIGITAL CONVERTER IN PHASE-LOCKED LOOP

CROSS-REFERENCE TO RELATED APPLICATIONS

This application is a continuation of International Application No. PCT/CN2015/095807, filed on Nov. 27, 2015, which claims priority to Chinese Patent Application No. 201510134242.4, filed on Mar. 25, 2015. The disclosures of the aforementioned applications are hereby incorporated by reference in their entireties.

TECHNICAL FIELD

The present invention relates to the field of phase-locked loop technologies, and in particular, to a time-to-digital converter in a phase-locked loop.

BACKGROUND

A phase-locked loop (PLL) is a technology to implement, by using a feedback control principle, that a phase difference between two signals keeps unchanged. For example, for two signals: a first signal and a second signal, a target phase difference between the two signals may be given arbitrarily, that is, a target time interval between a specified time point of the first signal and a preset time point of the second signal is given, and a current phase difference between the two signals is detected, that is, a current time interval between the specified time point of the first signal and the preset time point of the second signal is detected; and when the second signal is used as a reference signal, a phase of the first signal may be controlled according to the target time interval and the current time interval, so as to lock a time interval between the specified time point of the first signal and the preset time point of the second signal, that is, a phase difference between the two signals is locked.

In the phase-locked loop, an apparatus used to detect the current phase difference between the two signals, that is, to detect the current time interval between the specified time point of the first signal and the preset time point of the second signal is a time-to-digital converter (TDC). A time-to-digital converter in the prior art is shown in FIG. 1, mainly including a delay unit 101 into which a first signal is input and a sampling unit 102 into which a second signal is input, where in the first signal and the second signal, the second signal is a reference signal. The delay unit 101 includes multiple delayers with same delay duration that are connected in series, and is configured to delay the first signal, where delay duration of the delay unit 101 is greater than a cycle of the first signal. The sampling unit 102 is configured to: perform sampling on output signals D(1), D(2), . . . , D(n) of the delayers in the delay unit 101 at a preset time point of the second signal, and output sampled signals Q(1), Q(2), . . . , Q(n). A binary sequence Q[1:n] is formed by the sampled signals output by the sampling unit 102 carries information about a time interval between a rising edge time point/falling edge time point of the first signal and the preset time point of the second signal, that is, carries information about a phase difference between the two signals.

It is assumed that delay duration of a delayer is t1 and the cycle of the first signal is T1=8t1, the delay unit 101 needs to include at least eight delayers, for example, may include 10 delayers. The first signal, the second signal, and output signals D(1), D(2), . . . , D(10) of the 10 delayers are shown in FIG. 2, where all the output signals of the 10 delayers are in a same direction as that of the first signal. If the preset time point of the second signal is specifically a rising edge time point of the second signal, the sampling unit 102 performs sampling on the output signals of the 10 delayers in the delay unit 101 at the rising edge time point of the second signal. As shown in FIG. 2, at the rising edge time point of the second signal, the output signals D(1) and D(2) of the delayers are at a high level, D(3), D(4), D(5), and D(6) are at a low level, and D(7), D(8), D(9), and D(10) are at a high level. Therefore, a binary sequence Q[1:10] formed by sampled signals Q(1), Q(2), . . . , Q(10) output by the sampling unit 102 is 0011110000. The binary sequence carries information about time intervals between the rising edge time point of the second signal and the rising edge time point of the first signal, and between the rising edge time point of the second signal and the falling edge time point of the first signal. The first bit in the sequence is "0". The third bit hops to "1" after a time interval of two delayers from the first bit, which indicates that a time interval between the rising edge time point of the second signal and a falling edge time point of a first signal that is before and nearest to the rising edge time point of the second signal is the time interval of two delayers, that is, 2t1; and the seventh bit re-hops to "0" after a time interval of six delayers from the first bit, which indicates that a time interval between the rising edge time point of the second signal and a rising edge time point of the first signal that is before and nearest to the rising edge time point of the second signal is the time interval of six delayers, that is, 6t1.

Apparently, detection accuracy of an existing time-to-digital converter depends on the delay duration t1 of a delayer in the delay unit 101. If a delayer with relatively small delay duration is used, a large quantity of delayers are required, a cumulative impact of errors on the delayers is relatively large, and it is very difficult to implement the time-to-digital converter; therefore, a delayer with relatively large delay duration needs to be used, which causes relatively low detection accuracy of the existing time-to-digital converter, so that phase locking accuracy of the phase-locked loop is also relatively low.

SUMMARY

Embodiments of the present invention provide a time-to-digital converter in a phase-locked loop, to resolve a problem that phase locking accuracy of the phase-locked loop is relatively low.

According to a first aspect, a time-to-digital converter in a phase-locked loop is provided, including a delay unit into which a first signal is input and a sampling unit into which a second signal is input. The delay unit includes a first delay chain, a second delay chain, and a third delay chain that are connected in series in sequence, and is configured to delay the first signal. The first delay chain includes at least one first delayer, the second delay chain includes at least three second delayers, the third delay chain includes at least one third delayer, and delay duration of the first delayer and delay duration of the third delayer are greater than delay duration of the second delayer. The sampling unit is configured to perform sampling on output signals of first delayers in the first delay chain, second delayers in the second delay chain, and third delayers in the third delay chain in the delay unit at a preset time point of the second signal, and output sampled signals.

With reference to the first aspect, in a first possible implementation manner, in the delay unit, delay duration of the second delay chain is greater than a peak-to-peak value of jitter of a signal that is output by the phase-locked loop in an open-loop running state. Delay duration of the delay unit is greater than a cycle of the first signal.

With reference to the first aspect or the first possible implementation manner of the first aspect, in a second possible implementation manner, in the delay unit, delay duration of the first delay chain is the same as delay duration of the third delay chain, or different from delay duration of the third delay chain.

With reference to the first aspect, the first possible implementation manner of the first aspect, or the second possible implementation manner of the first aspect, in a third possible implementation manner, in the delay unit, the delay duration of the first delayer in the first delay chain and the delay duration of the third delayer in the third delay chain are 4 to 10 times the delay duration of the second delayer in the second delay chain.

With reference to the first aspect, the first possible implementation manner of the first aspect, the second possible implementation manner of the first aspect, or the third possible implementation manner of the first aspect, in a fourth possible implementation manner, in the delay unit, the delay duration of the first delayer in the first delay chain is the same as the delay duration of the third delayer in the third delay chain, or different from the delay duration of the third delayer in the third delay chain.

With reference to the first aspect, the first possible implementation manner of the first aspect, the second possible implementation manner of the first aspect, the third possible implementation manner of the first aspect, or the fourth possible implementation manner of the first aspect, in a fifth possible implementation manner, in the delay unit, a quantity of first delayers in the first delay chain is the same as a quantity of third delayers in the third delay chain, or different from a quantity of third delayers in the third delay chain.

With reference to the first aspect, the first possible implementation manner of the first aspect, the second possible implementation manner of the first aspect, the third possible implementation manner of the first aspect, the fourth possible implementation manner of the first aspect, or the fifth possible implementation manner of the first aspect, in a sixth possible implementation manner, in the delay unit, the first delayer in the first delay chain and/or the third delayer in the third delay chain are phase inverters.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, or the sixth possible implementation manner of the first aspect, in a seventh possible implementation manner, in the delay unit, the second delayer in the second delay chain is an RC delayer.

With reference to the first aspect, the first possible implementation manner of the first aspect, the second possible implementation manner of the first aspect, the third possible implementation manner of the first aspect, the fourth possible implementation manner of the first aspect, the fifth possible implementation manner of the first aspect, the sixth possible implementation manner of the first aspect, or the seventh possible implementation manner of the first aspect, in an eighth possible implementation manner, the sampling unit includes multiple triggers. In the delay unit, each first delayer in the first delay chain, each second delayer in the second delay chain, and each third delayer in the third delay chain are in a one-to-one correspondence with the triggers in the sampling unit. Each trigger performs, at the preset time point of the second signal, sampling on an output signal of the first delayer, the second delayer, or the third delayer corresponding to the trigger, and outputs a sampled signal. For each trigger, when the output signal of the first delayer, the second delayer, or the third delayer corresponding to the trigger is in a direction same as that of the first signal, the sampled signal is output from a non-inverting output end of the trigger. When the output signal of the first delayer, the second delayer, or the third delayer corresponding to the trigger is in a direction reverse to that of the first signal, the sampled signal is output from an inverting output end of the trigger.

According to a second aspect, a time-to-digital converter in a phase-locked loop is provided, including a delay unit into which a first signal is input and a sampling unit into which a second signal is input. The delay unit includes a first delay chain and a second delay chain that are connected in series, and is configured to delay the first signal, where the first delay chain includes at least one first delayer, the second delay chain includes at least three second delayers, and delay duration of the first delayer is greater than delay duration of the second delayer. The sampling unit is configured to perform sampling on output signals of first delayers in the first delay chain and second delayers in the second delay chain in the delay unit at a preset time point of the second signal, and output sampled signals.

With reference to the second aspect, in the delay unit, delay duration of the second delay chain is greater than a peak-to-peak value of jitter of a signal that is output by the phase-locked loop in an open-loop running state. Delay duration of the delay unit is greater than a cycle of the first signal.

With reference to the second aspect or the first possible implementation manner of the second aspect, in a second possible implementation manner, in the delay unit, the delay duration of the first delayer in the first delay chain is 4 to 10 times the delay duration of the second delayer in the second delay chain.

With reference to the second aspect, the first possible implementation manner of the second aspect, or the second possible implementation manner of the second aspect, in a third possible implementation manner, in the delay unit, the first delayer in the first delay chain is a phase inverter.

With reference to the second aspect, the first possible implementation manner of the second aspect, the second possible implementation manner of the second aspect, or the third possible implementation manner of the second aspect, in a fourth possible implementation manner, in the delay unit, the second delayer in the second delay chain is an RC delayer.

With reference to the second aspect, the first possible implementation manner of the second aspect, the second possible implementation manner of the second aspect, the third possible implementation manner of the second aspect, or the fourth possible implementation manner of the second aspect, in a fifth possible implementation manner, the sampling unit includes multiple triggers; in the delay unit, each first delayer in the first delay chain and each second delayer in the second delay chain are in a one-to-one correspondence with the triggers in the sampling unit. Each trigger performs, at the preset time point of the second signal, sampling on an output signal of the first delayer or the second delayer corresponding to the trigger, and outputs a sampled signal; and for each trigger, when the output signal of the first delayer or the second delayer corresponding to the trigger is in a direction same as that of the first signal, the sampled signal is output from a non-inverting output end of the trigger, and when the output signal of the first delayer or the second delayer corresponding to the trigger is in a direction reverse to that of the first signal, the sampled signal is output from an inverting output end of the trigger.

According to the time-to-digital converter in the phase-locked loop provided in the first aspect and the time-to-digital converter in the phase-locked loop provided in the second aspect, a delay unit that delays a first signal includes a first delay chain, a second delay chain, and a third delay chain that are connected in series in sequence, where both delay duration of a first delayer included in the first delay chain and delay duration of a third delayer included in the third delay chain are greater than delay duration of a second delayer included in the second delay chain, that is, both the first delay chain and the third delay chain use a delayer with relatively large delay duration, so that a quantity of delayers in the delay unit can be reduced, and it is easy to implement the time-to-digital converter; and the second delay chain uses a delayer with relatively small delay duration, so that detection accuracy of the time-to-digital converter can be improved, and phase locking accuracy of the phase-locked loop is further improved.

BRIEF DESCRIPTION OF THE DRAWINGS

The drawings are provided to further understand the present invention, and they constitute a part of the application. The drawings, along with the embodiments of the present invention, are used to explain the present invention, and impose no limitation on the present invention.

DETAILED DESCRIPTION OF ILLUSTRATIVE EMBODIMENTS

To propose an implementation solution for improving phase locking accuracy of a phase-locked loop, embodiments of the present invention provide a time-to-digital converter in a phase-locked loop. The following describes embodiments of the present invention with reference to the drawings in the application. It should be understood that the exemplary embodiments described herein are only used to describe and explain the present invention, but not to limit the present invention. Moreover, in a case that no conflict occurs, the embodiments in the application and features in the embodiments may be mutually combined.

Embodiment 1

Figure 1:
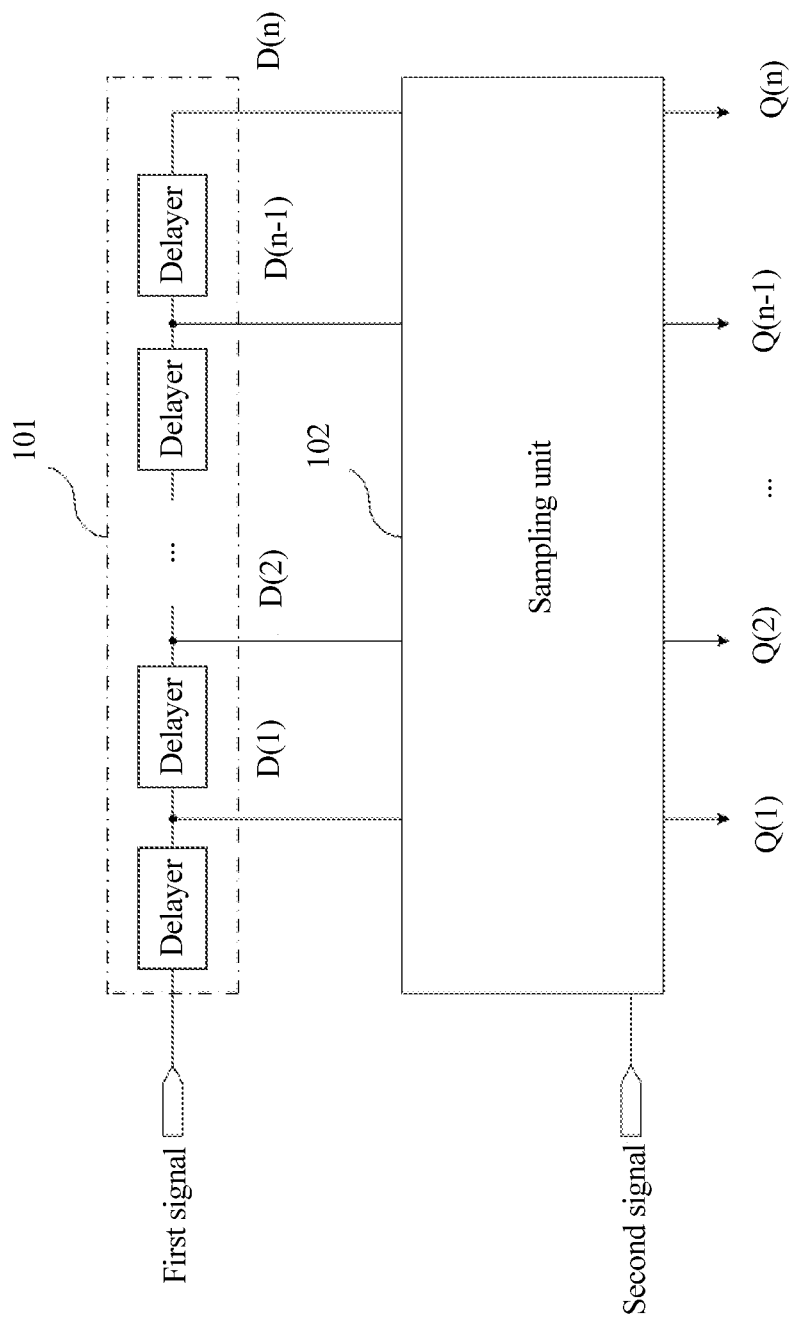
FIG. 1 is a schematic diagram of a time-to-digital converter in the prior art.
Figure 2:
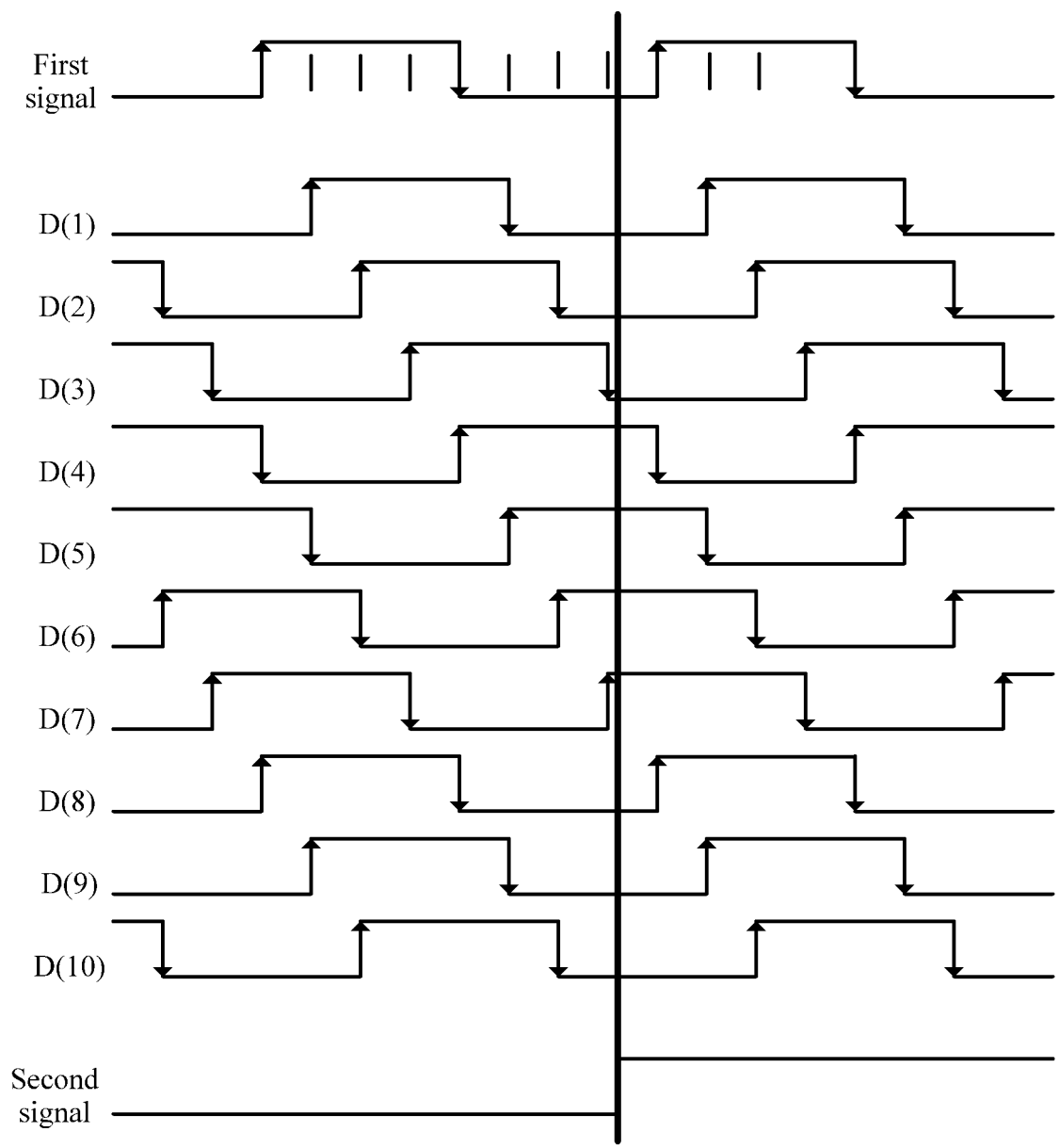
FIG. 2 is a schematic diagram of a principle of a time-to-digital converter in the prior art.
Figure 3:
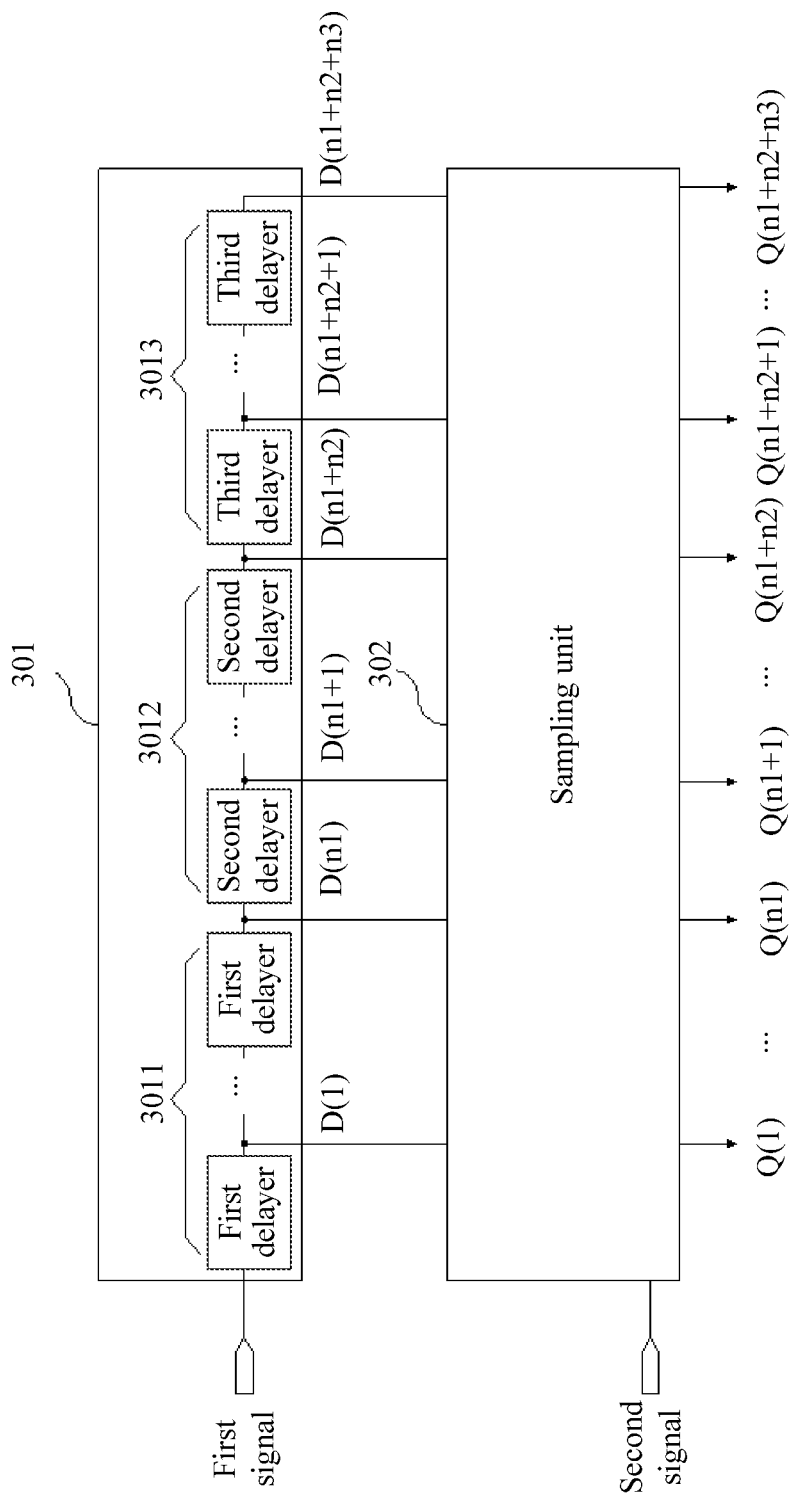
FIG. 3 is a schematic diagram 1 of a time-to-digital converter according to Embodiment 1 of the present invention.

Embodiment 1 of the present invention provides a time-to-digital converter in a phase-locked loop, which is shown in FIG. 3 and includes a delay unit 301 into which a first signal is input and a sampling unit 302 into which a second signal is input.

The delay unit 301 includes a first delay chain 3011, a second delay chain 3012, and a third delay chain 3013 that are connected in series in sequence, and is configured to delay the first signal, where the first delay chain 3011 includes at least one first delayer, the second delay chain 3012 includes at least three second delayers, the third delay chain 3013 includes at least one third delayer, and delay duration of the first delayer and delay duration of the third delayer are greater than delay duration of the second delayer.

The sampling unit 302 is configured to: perform sampling on output signals of first delayers in the first delay chain 3011, second delayers in the second delay chain 3012, and third delayers in the third delay chain 3013 in the delay unit 301 at a preset time point of the second signal, and output sampled signals.

In the delay unit 301, the first delay chain 3011 includes n1 first delayers connected in series, the second delay chain 3012 includes n2 second delayers connected in series, and the third delay chain 3013 includes n3 third delayers connected in series, where $n1 \geq 1$, $n2 \geq 3$, and $n3 \geq 1$. That is, in the sampled signals output by the sampling unit 302, at least one sampled signal is a sampled signal of an output signal of the first delayer, at least three sampled signals are sampled signals of output signals of the second delayer, and at least one sampled signal is a sampled signal of an output signal of the third delayer.

Generally, in the phase-locked loop, a clock signal CKV output by an oscillator is the foregoing first signal, and an external reference clock signal FREF is the foregoing second signal.

Further, delay duration of the delay unit 301 is greater than a cycle of the first signal. In the delay unit 301, delay duration of the second delay chain 3012 is greater than a peak-to-peak value of jitter of a signal that is output by the phase-locked loop in an open-loop running state, where the peak-to-peak value may be obtained in advance according to an actual application scenario and based on experimental data. In the delay unit 301, delay duration of the first delay chain 3011 may be the same as or different from delay duration of the third delay chain 3013, which is not specifically limited in the present invention.

In the delay unit in the time-to-digital converter provided in Embodiment 1 of the present invention, both the first delay chain 3011 and the third delay chain 3013 use a delayer with relatively large delay duration, and the second delay chain 3012 uses a delayer with relatively small delay duration. Specifically, in the delay unit 301, the delay duration of the first delayer in the first delay chain 3011 may be the same as or different from the delay duration of the third delayer in the third delay chain 3013. In the delay unit 301, a quantity of first delayers in the first delay chain 3011 may be the same as or different from a quantity of third delayers in the third delay chain 3013.

In a specific embodiment, the sampling unit 302 may specifically perform sampling on output signals D(1) . . . D(n1), D(n1+1) . . . D(n1+n2), and D(n1+n2+1) . . . D(n1+n2+n3) of first delayers in the first delay chain 3011, second delayers in the second delay chain 3012, and third delayers in the third delay chain 3013 in the delay unit 301 at a rising edge time point of the second signal, and output sampled signals Q(1) . . . Q(n1), Q(n1+1) . . . Q(n1+n2), and Q(n1+n2+1) . . . Q(n1+n2+n3). In this case, a binary sequence Q[1:n1+n2+n3] formed by the sampled signals output by the sampling unit 302 carries information about time intervals between the rising edge time point of the second signal and a rising edge time point of the first signal, and between the rising edge time point of the second signal and a falling edge time point of the first signal.

In another specific embodiment, the sampling unit 302 may also specifically perform sampling on output signals D(1) . . . D(n1), D(n1+1) . . . D(n1+n2), and D(n1+n2+1) . . . D(n1+n2+n3) of first delayers in the first delay chain 3011, second delayers in the second delay chain 3012, and third delayers in the third delay chain 3013 in the delay unit 301 at a falling edge time point of the second signal, and output sampled signals Q(1) . . . Q(n1), Q(n1+1) . . . Q(n1+n2), and Q(n1+n2+1) . . . Q(n1+n2+n3). In this case, a binary sequence Q[1:n1+n2+n3] formed by the sampled signals output by the sampling unit 302 carries information about time intervals between the falling edge time point of the second signal and a rising edge time point of the first signal, and between the falling edge time point of the second signal and a falling edge time point of the first signal.

In specific implementation, in the delay unit 301, the first delayer in the first delay chain 3011 may be specifically but is not limited to a phase inverter; the second delayer in the second delay chain 3012 may be specifically but is not limited to an RC delayer; and the third delayer in the third delay chain 3013 may be specifically but is not limited to a phase inverter.

The sampling unit 302 may be specifically implemented by but is not limited to multiple triggers. A clock end of each trigger is connected to the second signal. In this case, each first delayer in the first delay chain 3011, each second delayer in the second delay chain 3012, and each third delayer in the third delay chain 3013 in the delay unit 301 are in a one-to-one correspondence with the triggers in the sampling unit 302. Each trigger performs, at the preset time point of the second signal, sampling on an output signal of the first delayer, the second delayer, or the third delayer corresponding to the trigger, and outputs a sampled signal. It should be noted that, for each trigger, when the output signal of the first delayer, the second delayer, or the third delayer corresponding to the trigger is in a direction same as that of the first signal, the sampled signal is output from a non-inverting output end of the trigger, and when the output signal of the first delayer, the second delayer, or the third delayer corresponding to the trigger is in a direction reverse to that of the first signal, the sampled signal is output from an inverting output end of the trigger.

The following uses specific examples to further describe, with reference to the drawings, the time-to-digital converter in the phase-locked loop provided in Embodiment 1 of the present invention.

Figure 4:
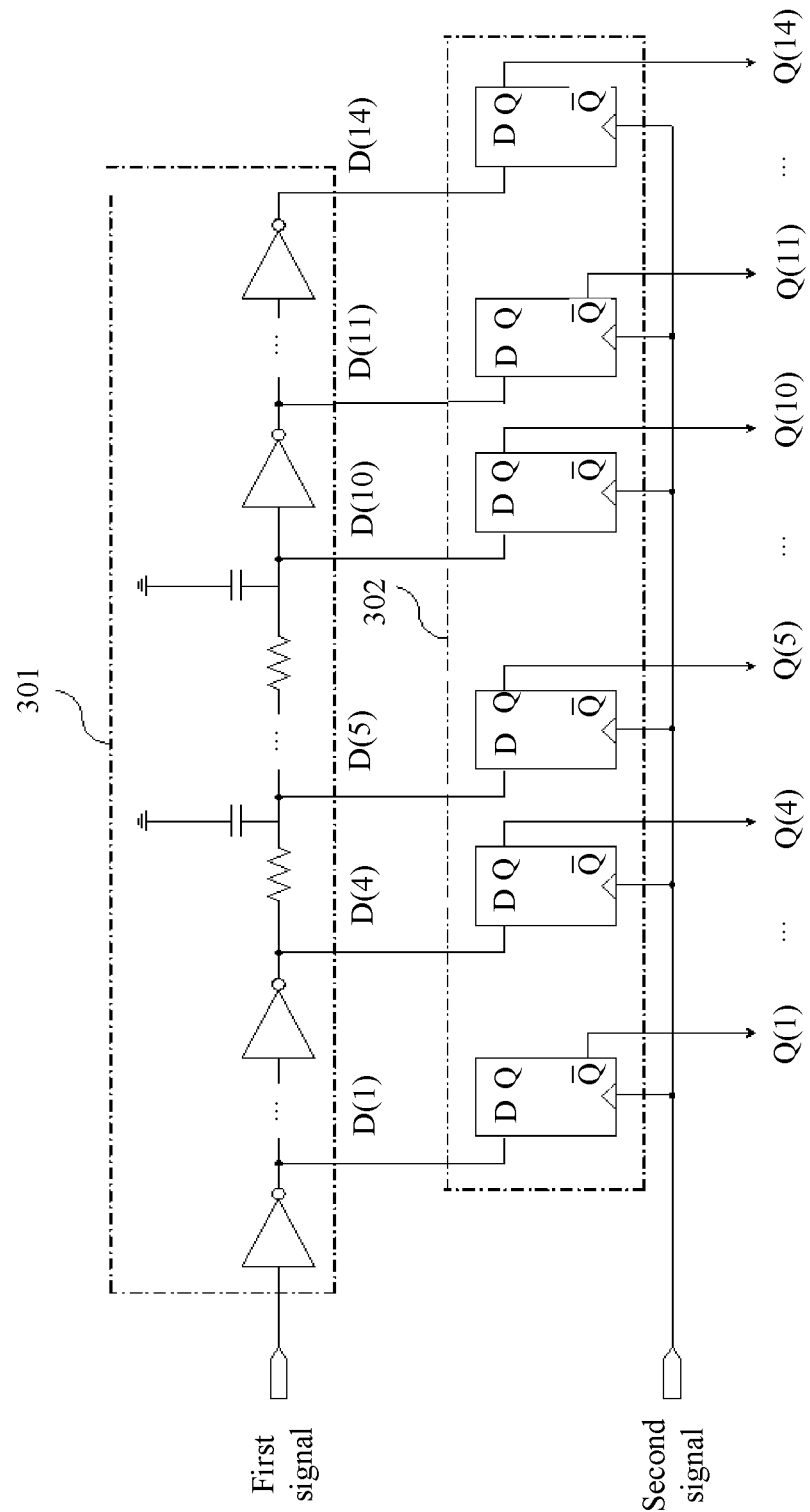
FIG. 4 is a schematic diagram 2 of a time-to-digital converter according to Embodiment 1 of the present invention.

It is assumed that in the delay unit 301, both the first delayer in the first delay chain 3011 and the third delayer in the third delay chain 3013 are phase inverters, and delay duration of both the first delayer and the third delayer is t1; the second delayer in the second delay chain 3012 is an RC delayer, and delay duration is t2, where t1=4t2; the peak-to-peak value of jitter of the signal that is output by the phase-locked loop in the open-loop running state is 5t2; therefore, the delay duration of the second delay chain 3012 is greater than 5t2, for example, may be 6t2, and in this case, the second delay chain 3012 includes six second delayers connected in series. The cycle of the first signal T1=8t1; therefore, a sum of the delay duration of the first delay chain 3011 and the delay duration of the third delay chain 3013 is greater than 8t1−6t2=6.5t1, for example, may be 8t1, and in this case, the first delay chain 3011 may include four first delayers connected in series, and the third delay chain 3013 may include four third delayers connected in series. If the sampling unit 302 is specifically implemented by multiple triggers, a specific structure of the time-to-digital converter in this case is shown in FIG. 4, and the first signal, the second signal, and output signals D(1), D(2), . . . , D(14) of the first delayers, the second delayers, and the third delayers are shown in FIG. 5, where D*(1) is a reverse signal of D(1), D*(3) is a reverse signal of D(3), D*(11) is a reverse signal of D(11), and D*(13) is a reverse signal of D(13).

If the preset time point of the second signal is specifically the rising edge time point of the second signal, the sampling unit 302 performs sampling on the output signals D(1), D(2), . . . , D(14) of the first delayers, the second delayers, and the third delayers in the delay unit 301 at the rising edge time point of the second signal. In this case, a binary sequence Q[1:14] formed by sampled signals Q(1), Q(2), . . . , Q(14) output by the sampling unit 302 is 00001111111000, which is shown as a vertical solid line in FIG. 5.

Figure 5:
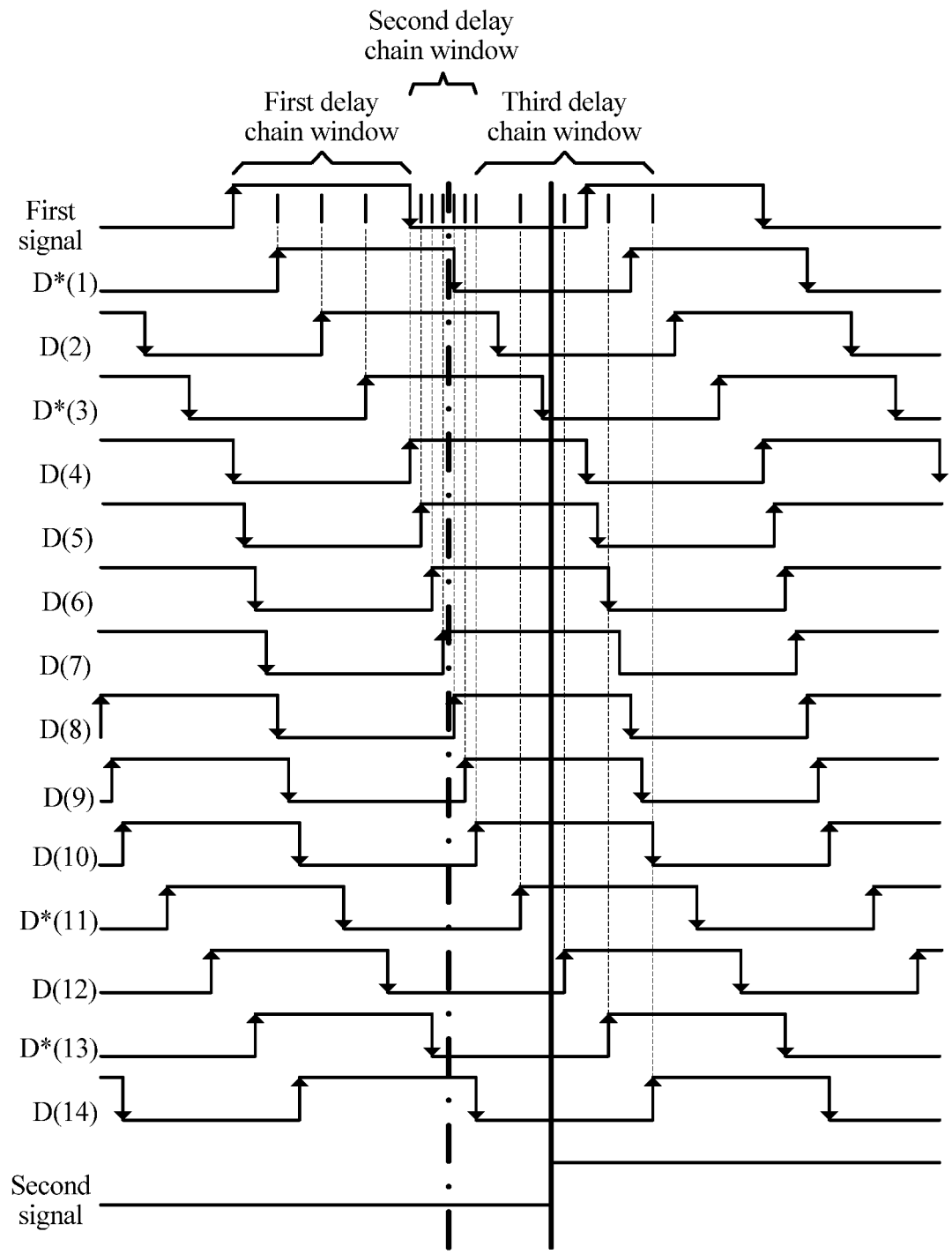
FIG. 5 is a schematic diagram of a principle of a time-to-digital converter according to Embodiment 1 of the present invention.

As shown in FIG. 5, in the first signal, an area corresponding to the first delay chain 3011 is a first delay chain window, where the first delay chain window indicates a delay range of the first signal delayed by the first delay chain 3011; an area corresponding to the second delay chain 3012 is a second delay chain window, where the second delay chain window indicates a delay range of the first signal delayed by the second delay chain 3012; and an area corresponding to the third delay chain 3013 is a third delay chain window, where the third delay chain window indicates a delay range of the first signal delayed by the third delay chain 3013. Apparently, if it is stipulated that, when the rising edge time point of the second signal is in the first delay chain window of the first signal, a phase difference between the two signals is a target phase difference; in this case, detection accuracy of the time-to-digital converter depends on the delay duration t1 of the first delayer in the first delay chain 3011, and because the delay duration of the first delayer is relatively large, the detection accuracy in this case is relatively low. If it is stipulated that, when the rising edge time point of the second signal is in the second delay chain window of the first signal, a phase difference between the two signals is a target phase difference; in this case, detection accuracy of the time-to-digital converter depends on the delay duration t2 of the second delayer in the second delay chain 3012, and because the delay duration of the second delayer is relatively small, the detection accuracy in this case is relatively high. If it is stipulated that, when the rising edge time point of the second signal is in the third delay chain window of the first signal, a phase difference between the two signals is a target phase difference; in this case, detection accuracy of the time-to-digital converter depends on the delay duration t1 of the third delayer in the third delay chain 3013, and because the delay duration of the third delayer is relatively large, the detection accuracy in this case is relatively low.

Therefore, in an actual operation, it may be stipulated that, when the rising edge time point of the second signal is in the second delay chain window of the first signal, the phase difference between the two signals is the target phase difference, and the phase-locked loop is in a locked state, which may, for example, be shown as a vertical dash-and-dot line in FIG. 5, and a binary sequence corresponding to the locked state is 11111110000001.

Apparently, if the delay duration of the second delayer in the second delay chain 3012 is smaller, the detection accuracy that can be provided by the time-to-digital converter is higher, but a cumulative impact of errors of the delayer is also larger; therefore, it is more difficult to implement the time-to-digital converter. Preferably, the delay duration of the first delayer in the first delay chain 3011 and the delay duration of the third delayer in the third delay chain 3013 may be specifically at least 4 to 10 times the delay duration of the second delayer in the second delay chain 3012. In this case, the time-to-digital converter can provide relatively high detection accuracy and is easy to implement.

The phase-locked loop is a technology to control a phase difference between two signals by using a feedback control principle, and the phase difference between the two signals jitters continually. Therefore, the second delay chain 3012 needs to include at least three second delayers, so as to meet a requirement of transverse jitter of the phase difference between the two signals and ensure detection accuracy.

In conclusion, according to the time-to-digital converter in the phase-locked loop provided in Embodiment 1 of the present invention, relatively high detection accuracy can be provided. Therefore, a phase noise of the time-to-digital converter is reduced, a phase noise of the phase-locked loop is further reduced, and phase locking accuracy of the phase-locked loop is improved.

Both the first delay chain 3011 and the third delay chain 3013 that are in the delay unit 301 use a delayer with relatively large delay duration. Therefore, not only a quantity of delayers can be reduced, power consumption is reduced, an area of an implemented circuit is reduced, and the time-to-digital converter is easier to implement, but when the time-to-digital converter is applied to the phase-locked loop, the phase difference between the two signals can reach the target phase difference as soon as possible, that is, the phase-locked loop is made to be in the locked state as soon as possible.

Embodiment 2

Figure 6:
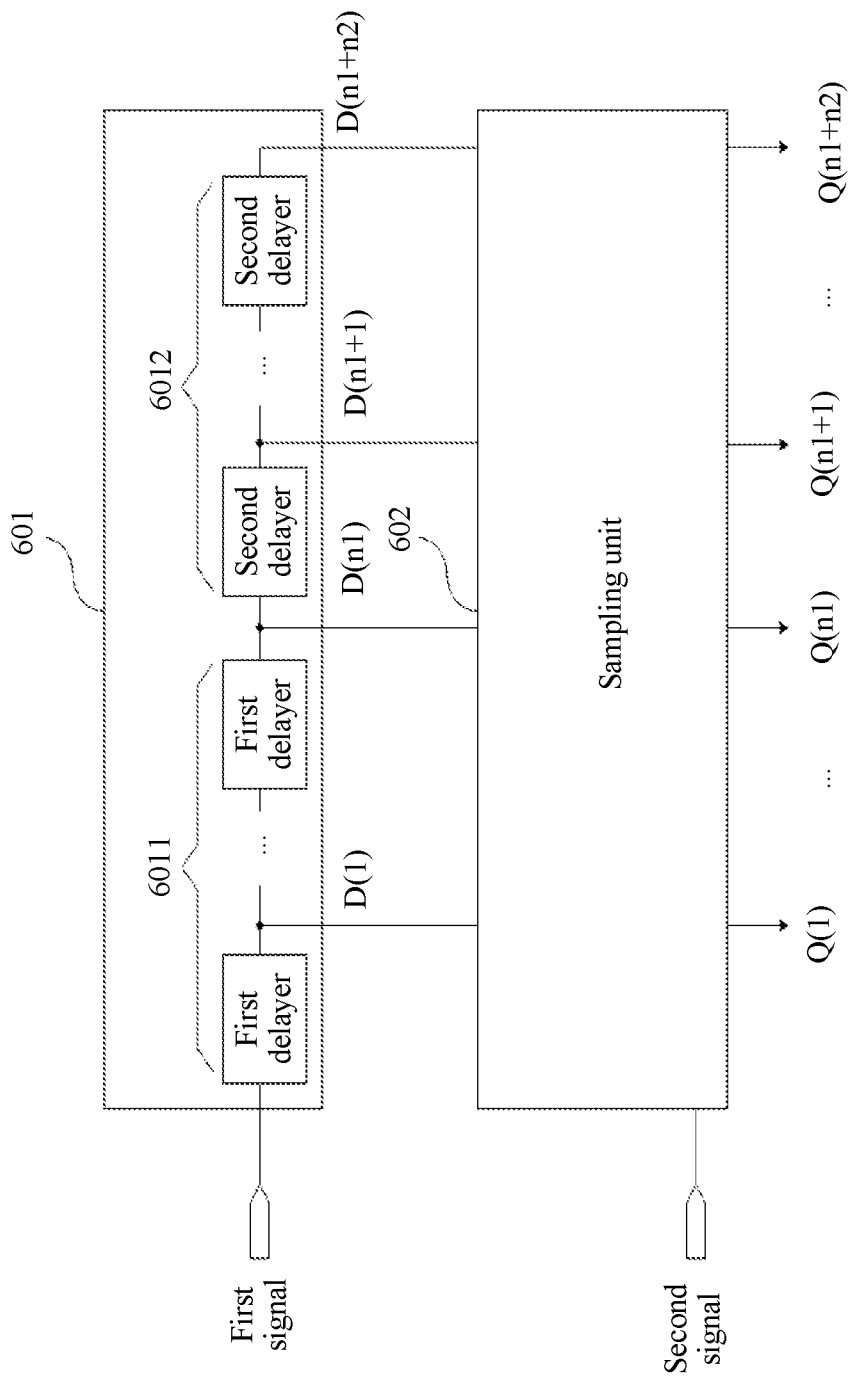
FIG. 6 is a schematic diagram of a time-to-digital converter according to Embodiment 2 of the present invention.

Based on a same invention concept, a structure of the time-to-digital converter in the phase-locked loop provided in Embodiment 1 of the present invention is simplified. Embodiment 2 of the present invention further provides a time-to-digital converter in a phase-locked loop, which is shown in FIG. 6 and includes a delay unit 601 into which a first signal is input and a sampling unit 602 into which a second signal is input.

The delay unit 601 includes a first delay chain 6011 and a second delay chain 6012 that are connected in series, and is configured to delay the first signal, where the first delay chain 6011 includes at least one first delayer, the second delay chain 6012 includes at least three second delayers, and delay duration of the first delayer is greater than delay duration of the second delayer.

The sampling unit 602 is configured to: perform sampling on output signals of first delayers in the first delay chain 6011 and second delayers in the second delay chain 6012 in the delay unit 601 at a preset time point of the second signal, and output sampled signals.

In the delay unit 601, the first delay chain 6011 includes n1 first delayers connected in series, and the second delay chain 6012 includes n2 second delayers connected in series, where n1≥1, and n2≥3. That is, in the sampled signals output by the sampling unit 602, at least one sampled signal is a sampled signal of an output signal of the first delayer, and at least three sampled signals are sampled signals of output signals of the second delayer.

Further, delay duration of the delay unit 601 is greater than a cycle of the first signal. In the delay unit 601, delay duration of the second delay chain 6012 is greater than a peak-to-peak value of jitter of a signal that is output by the phase-locked loop in an open-loop running state, where the peak-to-peak value may be obtained in advance according to an actual application scenario and based on experimental data.

In the delay unit 601, when the first delay chain 6011 and the second delay chain 6012 are connected in series, specifically as shown in FIG. 3, the first delay chain 6011 may be in front of the second delay chain 6012, or the second delay chain 6012 may be in front of the first delay chain 6011.

In the delay unit in the time-to-digital converter provided in Embodiment 2 of the present invention, the first delay chain 6011 uses a delayer with relatively large delay duration, and the second delay chain 6012 uses a delayer with relatively small delay duration. Preferably, the delay duration of the first delayer in the first delay chain 6011 may be specifically 4 to 10 times the delay duration of the second delayer in the second delay chain 6012. In this case, the time-to-digital converter can provide relatively high detection accuracy and is easy to implement.

In a specific embodiment, the sampling unit 602 may specifically perform sampling on output signals $D(1), \ldots, D(n1), D(n1+1), \ldots, D(n1+n2)$ of first delayers in the first delay chain 6011 and second delayers in the second delay chain 6012 in the delay unit 601 at a rising edge time point of the second signal, and output sampled signals $Q(1), \ldots, Q(n1), Q(n1+1), \ldots, Q(n1+n2)$. In this case, a binary sequence $Q[1:n1+n2]$ formed by the sampled signals output by the sampling unit 602 carries information about time intervals between the rising edge time point of the second signal and a rising edge time point of the first signal, and between the rising edge time point of the second signal and a falling edge time point of the first signal.

In another specific embodiment, the sampling unit 602 may specifically perform sampling on output signals $D(1), \ldots, D(n1), D(n1+1), \ldots, D(n1+n2)$ of first delayers in the first delay chain 6011 and second delayers in the second delay chain 6012 in the delay unit 601 at a falling edge time point of the second signal, and output sampled signals $Q(1), \ldots, Q(n1), Q(n1+1), \ldots, Q(n1+n2)$. In this case, a binary sequence $Q[1:n1+n2]$ formed by the sampled signals output by the sampling unit 602 carries information about time intervals between the falling edge time point of the second signal and a rising edge time point of the first signal, and between the falling edge time point of the second signal and a falling edge time point of the first signal.

In specific implementation, in the delay unit 601, the first delayer in the first delay chain 6011 may be specifically but is not limited to a phase inverter; and the second delayer in the second delay chain 6012 may be specifically but is not limited to an RC delayer.

The sampling unit 602 may be specifically implemented by but is not limited to multiple triggers. In this case, each first delayer in the first delay chain 6011 and each second delayer in the second delay chain 6012 in the delay unit 601 are in a one-to-one correspondence with the triggers in the sampling unit 602. Each trigger performs, at the preset time point of the second signal, sampling on an output signal of the first delayer or the second delayer corresponding to the trigger, and outputs a sampled signal. It should be noted that, for each trigger, when the output signal of the first delayer or the second delayer corresponding to the trigger is in a direction same as that of the first signal, the sampled signal is output from a non-inverting output end of the trigger, and when the output signal of the first delayer or the second delayer corresponding to the trigger is in a direction reverse to that of the first signal, the sampled signal is output from an inverting output end of the trigger.

A principle of the time-to-digital converter provided in Embodiment 2 of the present invention is similar to a principle of the time-to-digital converter provided in Embodiment 1 of the present invention. Compared with the prior art, phase locking accuracy of the phase-locked loop can also be improved, and no details are described with examples herein again.

Obviously, a person skilled in the art can make various modifications and variations to the present invention without departing from the spirit and scope of the present invention. The present invention is intended to cover these modifications and variations provided that they fall within the scope of protection defined by the following claims and their equivalent technologies.

What is claimed is:

1. A time-to-digital converter, comprising:
a delay circuit comprising an input configured to receive a first signal; and
a sampling circuit comprising an input configured to receive a second signal;
wherein the delay circuit and the sampling circuit are part of a phase-locked loop circuit;
wherein the delay circuit comprises a first delay chain, a second delay chain, and a third delay chain that are connected in series in sequence, and the delay circuit is configured to delay the first signal for a circuit delay duration, wherein the first delay chain comprises a first delayer, the second delay chain comprises three second delayers, the third delay chain comprises a third delayer, and a first delay duration from the first delayer and a third delay duration from the third delayer are each greater than a second delay duration from each of the three second delayers; and
wherein the sampling circuit is configured to perform a sampling on an output signal of each of the first delayer in the first delay chain, the three second delayers in the second delay chain, and the third delayer in the third delay chain at a preset time point of the second signal, and to output a signal of each sampling.

2. The time-to-digital converter according to claim 1, wherein the delay circuit duration is greater than a cycle of the first signal.

3. The time-to-digital converter according to claim 1, wherein:
a delay duration of the first delay chain is the same as a delay duration of the third delay chain; or
the delay duration of the first delay chain is different from the delay duration of the third delay chain.

4. The time-to-digital converter according to claim 1, wherein in the first delay duration and the third delay duration are 4 to 10 times the second delay duration.

5. The time-to-digital converter according to claim 1, wherein:
the first delay duration is the same as the third delay duration; or
the first delay duration is different from the third delay duration.

6. The time-to-digital converter according to claim 1, wherein the first delay chain comprises a plurality of first delayers, and the third delay chain comprises a plurality of third delayers; and
wherein a quantity of the plurality of first delayers in the first delay chain is different from or the same as a quantity of the plurality of third delayers in the third delay chain.

7. The time-to-digital converter according to claim 1, wherein the first delayer or the third delayer is a phase inverter.

8. The time-to-digital converter according to claim 1, wherein one of the three second delayers in the second delay chain is an RC delayer.

9. The time-to-digital converter according to claim 1, wherein the sampling circuit comprises a plurality of triggers;
wherein each trigger in the plurality of triggers is in a one-to-one correspondence with the first delayer in the first delay chain, the three second delayers in the second delay chain, and the third delayer in the third delay chain; and
wherein the sampling circuit is configured to perform the sampling and output the signal of each sampling, by each trigger being configured to perform, at the preset time point of the second signal, a respective sampling on an output signal of a respective one of the first delayer, one of the three second delayers, or the third delayer corresponding to the trigger, and to output a signal of a respective sampling; and
wherein for each trigger: when the output signal of the first delayer, one of the three second delayers, or the third delayer corresponding to the trigger is in a direction same as that of the first signal, the signal of the respective sampling is output from a non-inverting output end of the trigger; and when the output signal of the first delayer, the three second delayers, or the third delayer corresponding to the trigger is in a direction reverse to that of the first signal, the signal of the respective sampling is output from an inverting output end of the trigger.

10. The time-to-digital converter of claim 1, further comprising an oscillator disposed in the phase-locked loop circuit;
wherein the first signal comprises a clock signal CKV output by the oscillator; and
wherein the second signal comprises an external reference clock signal.

11. A time-to-digital converter, comprising:
a delay circuit comprising an input configured to receive a first signal and a sampling circuit comprising an input configured to receive a second signal;
wherein:
the delay circuit and the sampling circuit are part of a phase-locked loop circuit;
the delay circuit comprises a first delay chain and a second delay chain that are connected in series, and is configured to delay the first signal for a delay circuit duration, wherein the first delay chain comprises a first delayer, and the second delay chain comprises three second delayers, and a first delay duration from the first delayer is greater than second delay duration from each of the three second delayers; and
the sampling circuit is configured to perform a sampling on an output signal of each of the first delayers in the first delay chain and the three second delayers in the second delay chain at a preset time point of the second signal, and to output a signal of each sampling.

12. The time-to-digital converter according to claim 11, wherein the delay circuit duration is greater than a cycle of the first signal.

13. The time-to-digital converter according to claim 11, wherein the first delay duration is 4 to 10 times the second delay duration.

14. The time-to-digital converter according to claim 11, wherein the first delayer is a phase inverter.

15. The time-to-digital converter according to claim 11, wherein one of the three second delayers is an RC delayer.

16. The time-to-digital converter according to claim 11, wherein the sampling circuit comprises a plurality of triggers; and wherein each trigger in the plurality of triggers is in a one-to-one correspondence with the first delayer and each second delayer in the three second delayers in the second delay chain; and wherein the sampling circuit is configured to perform the sampling and output the signal of each sampling, by each trigger being configured to perform, at the preset time point of the second signal, a respective sampling on an output signal of a respective one of the first delayer or the second delayer corresponding to the trigger, and to output a respective signal of each sampling; and wherein, for each trigger: when the output signal of the first delayer or one of the three second delayers corresponding to the trigger is in a direction same as that of the first signal, the signal of the sampling is output from a non-inverting output end of the trigger; and when the output signal of the first delayer or one of the three second delayers corresponding to the trigger is in a direction reverse to that of the first signal, the signal of the sampling is output from an inverting output end of the trigger.

17. A method, comprising:

delaying, by a delay circuit, for a delay circuit duration, a first signal input into the delay circuit, wherein the delay circuit comprises a first delay chain and a second delay chain that are connected in series, wherein the first delay chain comprises a first delayer, and the second delay chain comprises three second delayers, and a first delay duration from the first delayer is greater than second delay duration from each of the three second delayers;

sampling, by a sampling circuit, a first output signal of the first delayer in the first delay chain, and a second output signal of the three second delayers in the second delay chain at a preset time of a second signal input into the sampling circuit; and outputting, by the sampling circuit, a first sampling signal from the first output signal, and a second sampling signal from the second output signal, wherein the delay circuit and the sampling circuit are part of a phase-locked loop circuit.

18. The method according to claim 17, wherein the first delay duration is 4 to 10 times the second delay duration.

19. The method according to claim 17, wherein the first delayer is a phase inverter and the three second delayers are RC delayers.

20. The method according to claim 17, further comprising:

receiving the first signal input, wherein the first signal input comprises a CKV output from an oscillator that is part of the phase-locked loop circuit with the delay circuit and the sampling circuit; and receiving the second signal input, wherein the second signal input comprises an external reference clock signal.

* * * * *